United States Patent
Wirbeleit

(10) Patent No.: US 8,164,145 B2
(45) Date of Patent: Apr. 24, 2012

(54) THREE-DIMENSIONAL TRANSISTOR WITH DOUBLE CHANNEL CONFIGURATION

(75) Inventor: Frank Wirbeleit, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 249 days.

(21) Appl. No.: 12/425,462

(22) Filed: Apr. 17, 2009

(65) Prior Publication Data

US 2009/0321835 A1    Dec. 31, 2009

(30) Foreign Application Priority Data

Jun. 30, 2008 (DE) .......... 10 2008 030 853

(51) Int. Cl.
*H01L 29/66* (2006.01)
*H01L 29/78* (2006.01)

(52) U.S. Cl. .......... 257/365; 257/E29.264; 257/E29.27

(58) Field of Classification Search .......... 257/260, 257/607, E29.264, E29.27, E29.347, 365
See application file for complete search history.

(56) References Cited

U.S. PATENT DOCUMENTS

| | | | | |
|---|---|---|---|---|
| 5,480,838 A * | 1/1996 | Mitsui | ........................ | 438/270 |
| 6,442,066 B1 * | 8/2002 | Prall | ........................ | 365/185.01 |
| 6,583,014 B1 | 6/2003 | Wu | ........................ | 438/284 |
| 7,202,517 B2 * | 4/2007 | Dixit et al. | ........................ | 257/287 |
| 7,368,344 B2 * | 5/2008 | Haller | ........................ | 438/242 |
| 7,374,986 B2 * | 5/2008 | Kim et al. | ........................ | 438/193 |
| 7,622,773 B2 * | 11/2009 | Irisawa et al. | ........................ | 257/347 |
| 2002/0011612 A1 * | 1/2002 | Hieda | ........................ | 257/262 |
| 2004/0150071 A1 * | 8/2004 | Kondo et al. | ........................ | 257/623 |
| 2004/0217433 A1 * | 11/2004 | Yeo et al. | ........................ | 257/412 |
| 2004/0262681 A1 * | 12/2004 | Masuoka et al. | ........................ | 257/335 |
| 2006/0170053 A1 * | 8/2006 | Yeo et al. | ........................ | 257/353 |
| 2007/0238273 A1 * | 10/2007 | Doyle et al. | ........................ | 438/525 |
| 2009/0001464 A1 * | 1/2009 | Booth et al. | ........................ | 257/347 |
| 2009/0184355 A1 * | 7/2009 | Brederlow et al. | ........................ | 257/296 |
| 2010/0065888 A1 * | 3/2010 | Shaheen et al. | ........................ | 257/194 |
| 2010/0072533 A1 * | 3/2010 | Ban et al. | ........................ | 257/314 |
| 2010/0072550 A1 * | 3/2010 | Matsuo | ........................ | 257/347 |
| 2010/0252816 A1 * | 10/2010 | Ko et al. | ........................ | 257/24 |
| 2010/0330759 A1 * | 12/2010 | Forbes | ........................ | 438/269 |

FOREIGN PATENT DOCUMENTS

| | | |
|---|---|---|
| DE | 102004037087 A1 | 3/2006 |
| DE | 102005038943 A1 | 3/2006 |
| DE | 102006004409 A1 | 8/2007 |

OTHER PUBLICATIONS

Translation of Official Communication from German Patent Office for German Patent Application No. 10 2008 030 853.6 dated May 6, 2009.

* cited by examiner

*Primary Examiner* — Caridad Everhart

(74) *Attorney, Agent, or Firm* — Williams, Morgan & Amerson, P.C.

(57) ABSTRACT

A three-dimensional double channel transistor configuration is provided in which a second channel region may be embedded into the body region of the transistor, thereby providing a three-state behavior, which may therefore increase functionality of conventional three-dimensional transistor architectures. The double channel three-dimensional transistors may be used for forming a static RAM cell with a reduced number of transistors, while also providing scalability by taking advantage of the enhanced controllability of FinFETS and nano pipe transistor architectures.

23 Claims, 7 Drawing Sheets

THREE-DIMENSIONAL TRANSISTOR WITH DOUBLE CHANNEL CONFIGURATION

BACKGROUND OF THE INVENTION

1. Field of the Invention

The present disclosure generally relates to the fabrication of integrated circuits, and, more particularly, to transistor architectures that enable an extended functionality of transistor devices, thereby providing the potential for simplifying the configuration of circuit elements, such as registers, static RAM cells and the like.

2. Description of the Related Art

In modern integrated circuits, such as microprocessors, storage devices and the like, a great number of circuit elements, especially transistors, are provided and operated on a restricted chip area. Although immense progress has been made over the recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. However, the continuing scaling of feature sizes involves great efforts in re-designing process techniques and developing new process strategies and tools to comply with new design rules. Generally, in complex circuitry including complex logic portions, MOS technology is presently a preferred manufacturing technique, in view of device performance and/or power consumption and/or cost efficiency. In integrated circuits including logic portions fabricated by MOS technology, a large number of field effect transistors (FETs) are provided that are typically operated in a switched mode, that is, these devices exhibit a highly conductive state (on-state) and a high impedance state (off-state). The state of the field effect transistor is controlled by a gate electrode, which may influence, upon application of an appropriate control voltage, the conductivity of a channel region formed between a drain terminal and a source terminal.

On the basis of field effect transistors, more complex circuit components may be created. For instance, storage elements in the form of registers, static RAM (random access memory) and dynamic RAM represent an important component of complex logic circuitries. For example, during the operation of complex CPU cores, a large amount of data has to be temporarily stored and retrieved, wherein the operating speed and the capacity of the storage elements significantly influence the overall performance of the CPU. Depending on the memory hierarchy used in a complex integrated circuit, different types of memory elements are used. For instance, registers and static RAM cells are typically used in the CPU core due to their superior access time, while dynamic RAM elements are preferably used as working memory due to the increased bit density compared to registers or static RAM cells. Typically, a dynamic RAM cell comprises a storage capacitor and a single transistor, wherein, however, a complex memory management system is required to periodically refresh the charge stored in the storage capacitors, which may otherwise be lost due to unavoidable leakage currents. Although the bit density of DRAM devices may be very high, a charge has to be transferred from and to storage capacitors in combination with periodic refresh pulses, thereby rendering these devices less efficient in terms of speed and power consumption when compared to static RAM cells. On the other hand, static RAM cells require a plurality of transistor elements to allow the storage of an information bit.

In order to reduce the number of transistor elements in static RAM cells, it has, therefore, been proposed to use planar field effect transistors with increased functionality compared to conventional field effect transistors by providing a modified body region of the field effect transistors on the basis of an additional doped region to provide a "second" channel region, which may impart a different transistor characteristic to these so-called double channel planar field effect transistors. That is, by providing an additional second channel region in the body of the planar field effect transistor, the trans-conductance of the transistor may be modified to generate a local maximum of the drain source current, thereby obtaining a three-state transfer slope, which may be used for providing basic transistor circuits with increased functionality. For instance, in conventional planar transistor architectures, a RAM cell with a reduced number of transistors may be provided.

FIG. 1a schematically illustrates a cross-sectional view of a conventional planar transistor element 100 that may be used in forming an electronic circuit, such as a RAM cell, with enhanced functionality or with a reduced number of circuit elements compared to conventional strategies by taking advantage of the three-state transistor transfer slope. The transistor element 100 comprises a substrate 101, which may be any appropriate substrate, such as a bulk semiconductor substrate, an insulating substrate having formed thereon a crystalline semiconductor layer and the like. For example, the substrate 101 may represent a bulk silicon substrate or a silicon-on-insulator (SOI) substrate, since presently, and in the near future, the majority of complex and integrated circuits are and will be fabricated on the basis of silicon. A substantially crystalline semiconductor region 102 is formed on the substrate 101 and comprises a specified dopant material to provide a desired conductivity type of the region 101. In the example shown in FIG. 1a, the semiconductor region 102 is doped to provide a P-type conductivity. Furthermore, drain and source regions 104 are formed adjacent to the region 102 and include a dopant material that imparts a conductivity type to the drain and source regions 104 that is opposite to the conductivity type of the semiconductor region 102. In the example shown, the drain and source regions 104 are heavily doped so that corresponding PN junctions are formed along interfaces between the drain and source regions 104 and the semiconductor region 102. Moreover, a channel region 103 is located between the drain and source regions 104 according to typical planar transistor configurations and comprises a first channel sub-region 103A that is oppositely doped with respect to the drain and source regions 104. For example, the first channel sub-region 103A may be considered a "conventional" channel region of a conventional enhancement transistor. Furthermore, the channel region 103 comprises a second channel sub-region 103B that is oppositely doped with respect to the first channel sub-region 103A and may therefore be considered a "depletion" channel. In the example shown, the planar field effect transistor 100 of FIG. 1a represents an N-type transistor and therefore the first channel sub-region 103A is P-doped and the second channel sub-region 103B is N-doped. The transistor element 100 further comprises a gate electrode 105 that is located above the channel region 103, i.e., above the first and second channel sub-regions 103A, 103B, thereby enabling a capacitive coupling of the gate electrode 105 to the channel region 103. Furthermore, in the example shown, the gate electrode 105 is separated from the channel region 103 by a gate insulation layer 106 formed on the top surface of the basic semiconductor layer, in which the drain and source regions 104 and the channel region 103 are provided. The gate insulation layer 106 may be comprised of silicon dioxide and/or silicon nitride and/or silicon oxynitride and/or high-k dielectric materials and the like, according to well-established planar transistor architectures. The transistor element 100, which may also be referred to as a double channel transistor due to the configuration of the channel region 103, further comprises sidewall spacers 107 formed on sidewalls of the gate electrode 105 in accordance with well-established planar transistor configurations. Furthermore, other components, such as metal silicide regions in the drain and source regions 104 and the gate electrode 105 may be provided to enhance overall conductivity and thus transistor performance. For convenience, any such performance enhancing components are not illustrated. In some conventional approaches for forming a planar double channel transistor, a contact area 108 is provided that connects to a portion of the semiconductor region 102, which in combination with the channel region 103 may also be referred to as the body region of the transistor 100. The contact area 108 is thus electrically connected to the body region while at the same time being electrically isolated from the drain and source regions 104 by the corresponding PN junctions. By means of the contact area 108, the body region of the transistor 100 may be connected to an appropriate reference voltage, which may enhance the controllability of the transistor 100.

The transistor 100 may be formed on the basis of well-established conventional transistor manufacturing process flows including the fabrication of appropriate isolation structures (not shown) in order to define respective active areas for a plurality of transistors, such as the transistor 100. Next, the basic doping of the body region of the transistor may be established by well-established implantation techniques, followed by the incorporation of an opposite dopant species in order to define the second channel sub-region 103B within the body region. Next, the gate electrode 105 in combination with the gate insulation layer 106 may be formed, for instance by forming the gate dielectric material by oxidation and/or deposition followed by the deposition of an appropriate gate electrode material, such as polysilicon and the like, which may subsequently be patterned on the basis of sophisticated lithography techniques. Thereafter, an offset spacer (not shown) may be formed, if required, and an implantation sequence may be performed to define a first portion of the drain and source regions 104, which may also include a corresponding halo implantation process. That is, during the halo implantation, a conductivity type may be induced, for instance on the basis of a tilted implantation process, which is of opposite conductivity type compared to that obtained by the dopant species for the drain and source regions. Consequently, in addition to adjusting the dopant gradient at the PN junctions, the second channel sub-region 103B may also be "isolated" from the drain and source regions due to the counter doping obtained by the halo implantation, which may result in a higher dopant concentration at the areas between the second channel sub-region 103B and the drain and source regions so as to impart an overall conductivity to these areas that correspond to the conductivity type of the remaining body region. Thereafter, the spacer structure 107 may be formed in accordance with well-established spacer techniques. The drain and source regions 104 may be completed by respective ion implantation processes, followed by appropriately designed anneal cycles in order to activate the dopant species and re-crystallize implantation-induced damage, thereby also adjusting the final dopant profile.

FIG. 1b schematically illustrates the functional behavior of the double channel transistor 100. In FIG. 1b, the conductivity of the transistor 100, i.e., the conductivity of the channel region 103, is plotted along the vertical axis in arbitrary units, and the control voltage $V_G$ supplied to the gate electrode 105 is shown on the horizontal axis. The double channel transistor 100 exhibits a significantly modified trans-conductance compared to conventional single channel planar field effect transistors due to the presence of the second channel region in that the conductivity of the transistor 100 has a more or less pronounced local maximum. As illustrated, when the control voltage $V_G$ exceeds a first threshold voltage $V_{T1}$, a typical increase of the conductivity may be obtained, as is the case for conventional planar enhancement transistors. At a second threshold voltage $V_{T2}$, however, a significant drop of the conductivity with increasing control voltage $V_G$ may be observed, resulting in a local minimum at a third threshold voltage $V_{T3}$ at which a further increase in conductivity with an increasing control voltage $V_G$ may be observed. Consequently, the local maximum or minimum at voltages $V_{T2}$ and $V_{T3}$, respectively, may provide an intermediate stable state in the transfer slope of the transistor 100, which may be advantageously used in order to build basic electronic circuits of increased functionality for the same number of circuit elements as in conventional designs, while in other cases a desired functionality may be accomplished on the basis of a reduced number of circuit elements by replacing one or more of the conventional planar field effect transistors by a planar double channel transistor, such as the transistor 100.

Although significant advantages may be gained with respect to increased functionality and/or reduced area consumption of basis electronic circuits, such as RAM cells, which may be provided on the basis of less than 6 planar double channel transistors, a further advance with respect to increased information density per chip unit area may be difficult to be achieved due to the limitations of appropriate control of current flow between the source and drain regions in planar transistor configurations. In particular, for device generations with highly scaled transistor elements including gate electrode structures having a length of 30 nm and less, extremely complex manufacturing techniques may have to be applied to account for the reduced controllability of the transistor behavior. In the corresponding transistor elements, extremely complex dopant profiles, in combination with sophisticated gate electrode structures, may have to be used, possibly in combination with a plurality of additional mechanisms, such as strain-inducing mechanisms and the like, in order to obtain the required performance with respect to drive current and controllability. Consequently, the provision of a second channel region may contribute to a corresponding high degree of complexity of establishing an appropriate dopant profile in planar field effect transistors having a second channel region. Thus, in view of a further scalability of the overall device dimensions, drive current capability and/or channel controllability may be difficult to be realized according to conventional techniques, as described above.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to transistor devices having an increased functionality in combination with the potential for further scalability in that a three-dimensional transistor configuration may be provided, in which the body region of the transistor may comprise an additional doped region, thereby defining a volume within the body region that may act as a "second" channel region. Consequently, by appropriately positioning the "second" channel region within the body of a three-dimensional transistor, such as a FinFET, a tri-gate transistor, a nano wire or nano pipe field effect transistor and the like, enhanced controllability of the body region, i.e., the channel of the three-dimensional transistor architecture, is achieved, while nevertheless creating a modified trans-conductance of the transistor, which may result in a three-state behavior, as previously explained for conventional planar double channel transistor. By using a three-dimensional configuration, i.e., by providing a gate electrode structure on non-coplanar surface areas of the body region or on a curved surface, in the case of nano wire or nano pipe FET, overall controllability and current flow may be enhanced, while nevertheless the lateral dimensions of the transistors may be reduced more efficiently compared to conventional planar transistor architectures. In some illustrative aspects disclosed herein, the three-state behavior of the transistor slope may be used to form a memory cell, which may comprise a reduced number of transistor elements due to the intrinsic characteristics of the three-dimensional transistors including an additional channel volume, while also a further scalability may be provided due to the generally three-dimensional architecture.

One illustrative field effect transistor disclosed herein comprises a drain region and a source region having a first conductivity type. The field effect transistor further comprises a body region formed at least between the drain and source regions, wherein the body region has a second conductivity type other than the first conductivity type and wherein the body region comprises at least two non-coplanar surface areas. Furthermore, a gate insulation material is formed on the at least two non-coplanar surface areas and a gate electrode is formed on the gate insulation material to define a first channel region in the body region at least at the two non-coplanar surface areas. Finally, a second channel region is formed in the body region and has the first conductivity type.

A further illustrative field effect transistor disclosed herein comprises a drain region and a source region having a first conductivity type. Furthermore, a tube-shaped body region is formed between the drain and source regions, wherein the body region has a second conductivity type other than the first conductivity type. Moreover, a gate insulation material is formed on a surface area of the tube-shaped body region and a gate electrode is formed on the gate insulation material to define a first channel region in the body region at least adjacent to the surface area. Finally, the field effect transistor comprises a second channel region formed in the body region, wherein the second channel region comprises the first conductivity type.

One illustrative memory cell disclosed herein comprises at least one three-dimensional field effect transistor which comprises a body region containing a first area having a first conductivity type and a second area having a second conductivity type opposite to the first conductivity type, wherein the three-dimensional field effect transistor further comprises a body contact connected to the first area.

BRIEF DESCRIPTION OF THE DRAWINGS

The disclosure may be understood by reference to the following description taken in conjunction with the accompanying drawings, in which like reference numerals identify like elements, and in which.

Figure 1A:
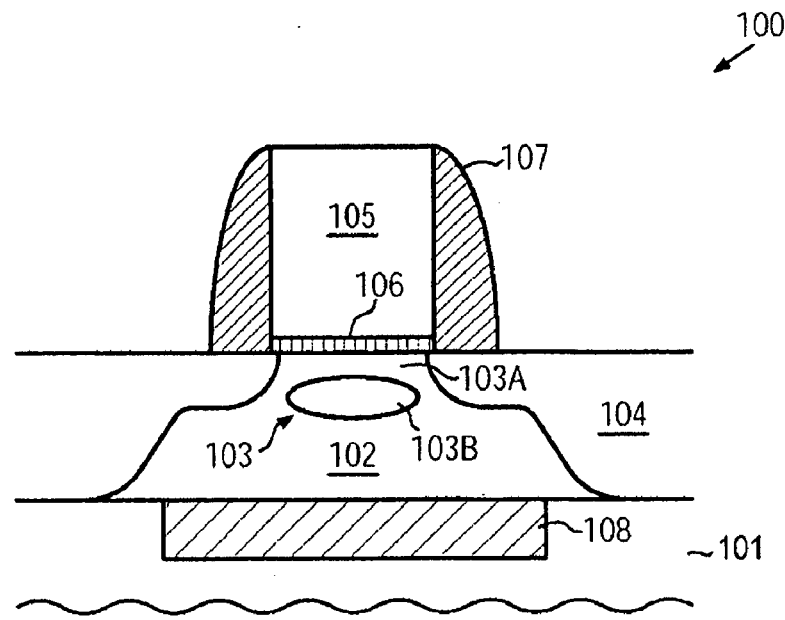
FIG. 1a schematically illustrates a cross-sectional view of a planar double channel field effect transistor including a second channel region in the body, according to conventional techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
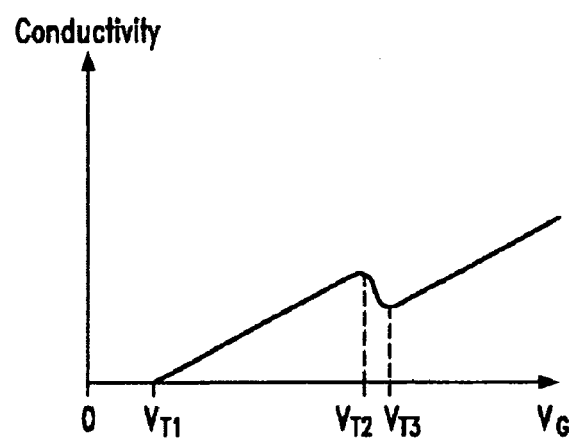
FIG. 1b schematically illustrates a three-state behavior of a double channel field effect transistor, which may be used in forming circuits, such as memory cells, having a reduced number of transistor elements.
Figure 2A:
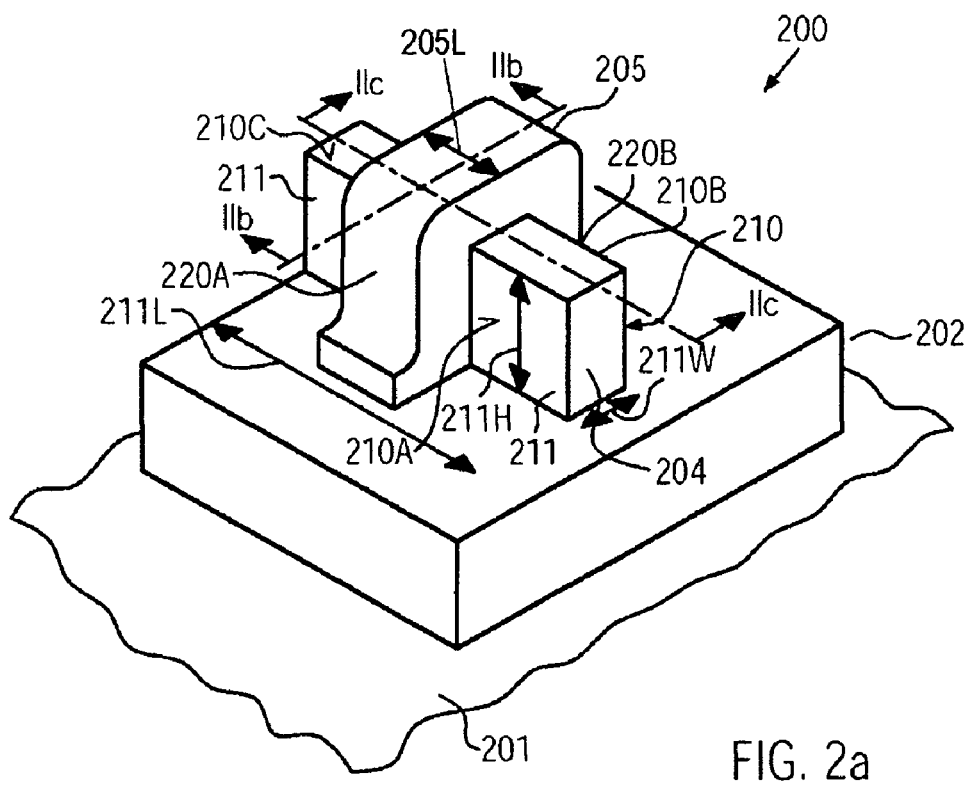
FIG. 2a schematically illustrates a perspective view of a three-dimensional transistor configuration in the form of a FinFET or a tri-gate transistor including an additional channel area, according to illustrative embodiments.

FIG. 2a schematically illustrates a perspective view of a three-dimensional transistor 200 having a three-state behavior, as is, for instance, described previously with respect to FIG. 1b. The transistor 200 may comprise a substrate 201, which may represent any appropriate carrier material, such as a semiconductor material, an insulating material and the like. For example, the substrate 201 may be comprised of a silicon material since, as previously explained, the virtually unrestricted availability, in combination with the technological experience gained over the past decades, may render silicon as a preferred candidate for complex integrated circuits of future device generations. It should be appreciated, however, that any other appropriate semiconductor material may be used. Furthermore, in the embodiment shown, the transistor 200 may represent an SOI configuration in which an insulating material 202, such as a silicon dioxide material and the like, may be used as a platform for providing thereon the basic transistor structure, similarly as in conventional planar SOI techniques. As will be described later on, in some illustrative embodiments, at least portions of the transistor 200 may be provided in a bulk configuration in which an increased silicon volume may be provided in the depth direction. Furthermore, a semiconductor fin 210 may be formed on the layer 202, wherein the fin 210 may be provided with any appropriate dimensions as is required for the basic transistor characteristics. That is, typically, the fin 210 may have a specified height 211H and a width 211W while a length 211L may be less critical for the overall device performance. The fin 210 may comprise drain and source regions or at least portions thereof, indicated as 204, which may be separated by a body region (not shown in FIG. 2a) which may comprise a "double channel" configuration, as will be described in more detail with reference to FIGS. 2b-2c. Furthermore, a gate electrode structure 205 may be provided, which may comprise any appropriate gate electrode material, such as polysilicon and the like, in combination with a gate insulation material (not shown), such as conventional dielectrics in the form of silicon dioxide and the like, high-k dielectrics or any combination thereof. The gate electrode structure 205 may be formed at least on sidewall portions 210A, 210B of the fin 210. Furthermore, in the embodiment shown, the gate electrode 205 may also be effectively coupled to a top surface 210C of the fin 210 so that an effective capacitive coupling via the surface area 210C into the body region may also be achieved. In other embodiments (not shown), a dielectric cap layer of increased thickness may be provided on the top surface 210C, thereby providing a significant increased distance between the gate electrode structure 205 and the surface 210C, thereby reducing or substantially eliminating any influence of the gate electrode structure 205 on the body region via the surface 210C. A corresponding transistor configuration in which the capacitive coupling may be accomplished by means of the two side surfaces 210A, 210B may be referred to as a FinFET architecture, while the embodiment shown in FIG. 2a may also be referred to as a tri-gate transistor architecture. Consequently, the three-dimensional transistor 200 as well as the gate electrode structure 205 is formed on two surface areas that are not within a single plane, which will be referred to in the following as non-coplanar surface areas. Hence, the sidewall surfaces 210A, 210B may be referred to as non-coplanar surface areas and the surfaces 210A, 210C may also be referred to as non-coplanar surface areas. It should be appreciated that a current flow may be established along the length direction of the fin 210 so that a respective transistor length may be substantially determined by the dimension 205L of the gate electrode structure 205, while the effective "transistor width" may be substantially determined by the height 211H and the width 211W of the fin 210.

Figure 2B:
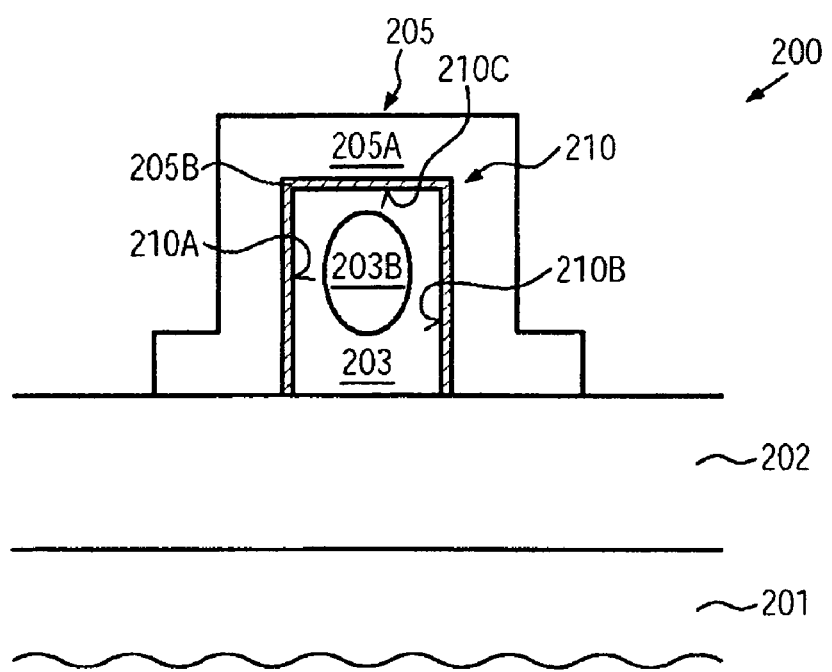
FIG. 2b schematically illustrates a cross-sectional view of the three-dimensional transistor of FIG. 2a according to illustrative embodiments.

FIG. 2b schematically illustrates a cross-sectional view along the section IIb of FIG. 2a. As illustrated, the portion of the fin 210 covered by the gate electrode structure 205 may represent the channel area or body region 203, which may have a specific conductivity type in accordance with the overall transistor configuration. For instance, for an N-channel transistor, the region 203 may have a basic P-doping, while for a P-channel transistor, a basic N-doping may be established in the body region 203. Thus, the body region 203 may have a specific conductivity type, such as a P-type conductivity for an N-channel transistor and an N-type conductivity for a P-channel transistor. Moreover, a "second" channel region 203B is embedded in the body region 203, which may represent a first channel region, at least in the vicinity of respective surface areas 210A, 210B and 210C. It should be appreciated that, although in the embodiment shown in FIG. 2b the second channel region 203B is illustrated so as to be completely embedded in the body region 203, in other illustrative embodiments, the corresponding dopant concentration of the second channel region 203B may extend to one of the surface areas 210A, 210B, 210C as long as the desired three-state behavior may be achieved. For example, the second channel region 203B may extend along the horizontal direction in FIG. 2b so as to connect to the corresponding sidewall surface areas 210A, 210B.

Furthermore, as illustrated, the gate electrode structure 205 may comprise a gate electrode material 205A, which is separated from the corresponding surface areas 210A, 210B and 210C by a gate insulation layer 205B. It should be appreciated that, due to the enhanced controllability of the body region 203, including the second channel region 203B, less demanding requirements may have to be met with respect to the thickness of the gate insulation material 205B compared to a planar transistor configuration providing similar drive current. Nevertheless, in view of further device scaling, highly sophisticated gate electrode structures, for instance in the form of metal-containing gate electrode materials in combination with high-k dielectric materials may be used.

Figure 2C:
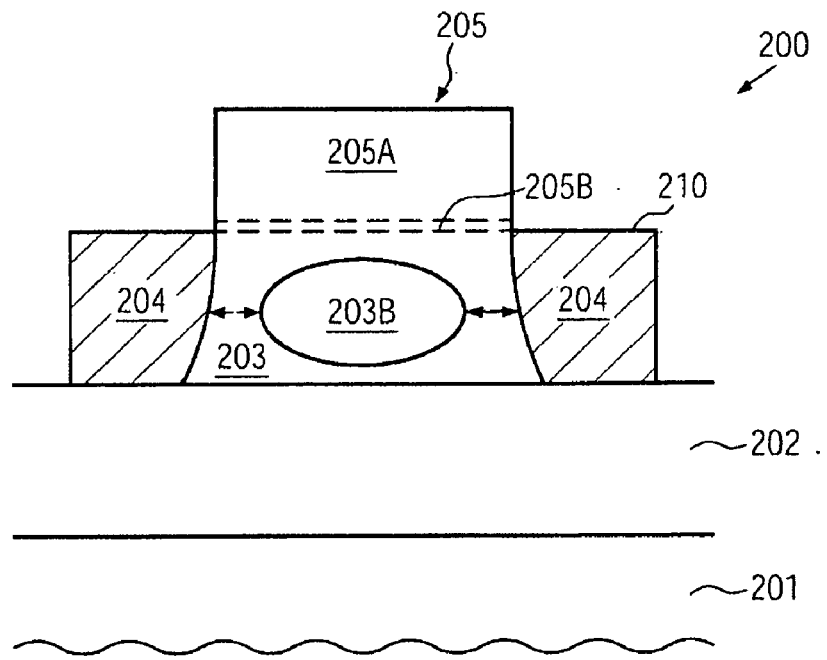
FIG. 2c schematically illustrates a cross-sectional view along a length direction of a fin of the three-dimensional transistor.

FIG. 2c schematically illustrates the transistor 200 along the section IIc of FIG. 2a. As illustrated, the body region 203 may be located between the drain and source regions 204, while, in the embodiment shown, the second channel region 203B may be "isolated" from the drain and source regions 204 by the body region 203. Furthermore, if the second channel region 203B may also have an "isolated" configuration as shown in FIG. 2b, the second channel region 203B may be considered as being fully embedded into the body region 203.

Due to the provision of the second channel region 203B, the transistor characteristics of the device 200 may be completely different from conventional three-dimensional transistor architectures, in that the pronounced local maximum or minimum in the transistor transfer slope may be obtained during transistor operation, as is also explained with reference to FIG. 1b. Consequently, the three-dimensional transistor 200 may provide enhanced functionality compared to conventional three-dimensional transistor structures, while at the same time extending scalability of known planar double channel transistors.

Figure 2D:
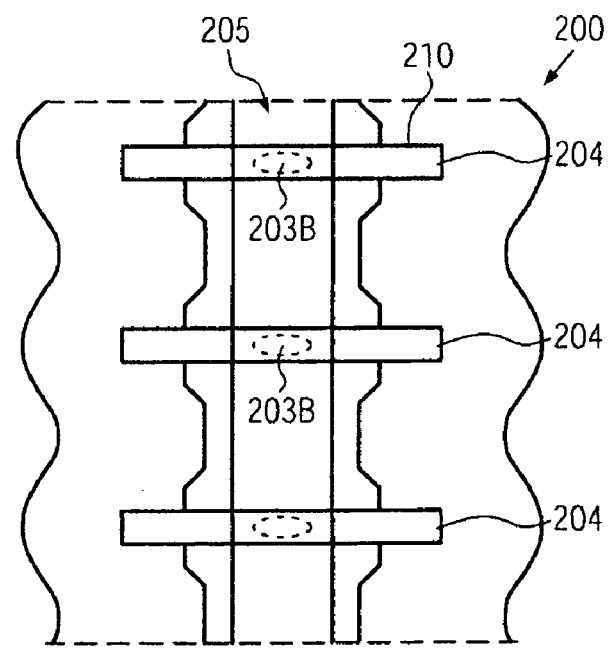
FIG. 2d schematically illustrates a top view illustrating a plurality of transistor cells of a three-dimensional transistor, wherein each transistor cell comprises a second channel area, according to illustrative embodiments.

FIG. 2d schematically illustrates a top view of the transistor 200 in which a plurality of transistor cells, each comprising a respective fin 210 and a combined gate electrode structure 205, may be provided, while a common drain and source area may connect to each of the drain and source regions 204 provided in the end portions of the fins 210, as previously described. Thus the overall drive current capability of the transistor 200 may be adjusted by providing a desired number of individual transistor cells, each of which may comprise the second channel region 203B in the body region 203.

The transistor 200 as shown in FIGS. 2a-2d may be formed on the basis of process techniques as will be described with reference to FIGS. 2e-2i.

Figure 2E:
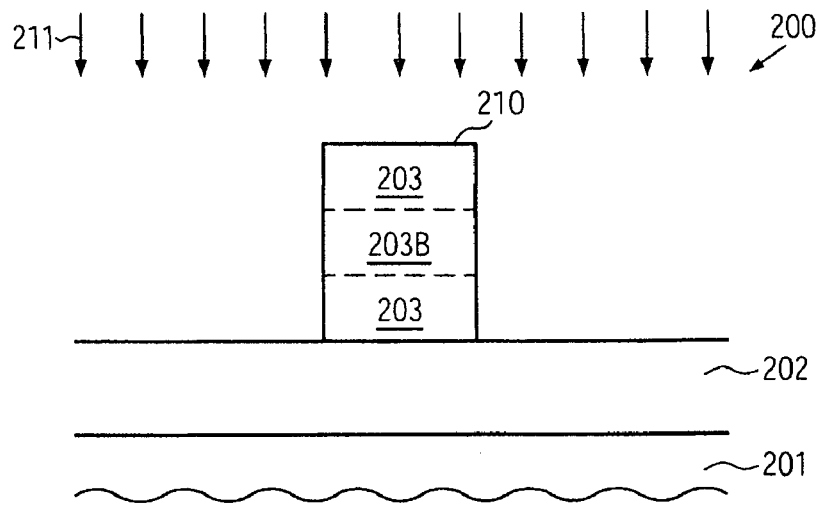
FIGS. 2e-2i schematically illustrate various sectional views of the three-dimensional transistor having a double channel configuration during various manufacturing stages, according to illustrative embodiments.

FIG. 2e schematically illustrates the semiconductor device 200 in an early manufacturing stage. As illustrated, the fin 210 may be formed on the insulating layer 202, which may be accomplished by sophisticated lithography and etch techniques. For example, a basic silicon layer or any other semiconductor layer formed on the insulating layer 202, which may also be referred to as a buried insulating layer, may be appropriately patterned so as to obtain the fins 210 in any appropriate number as may be required for adjusting the overall drive current capability, as previously illustrated with reference to FIG. 2d. In FIG. 2e, the basic doping or "well" doping of the body region 203 may have been established, for instance on the basis of well-established implantation techniques. Prior to or after the generation of the basic well doping for defining the body region 203, a further implantation process 211 may be performed on the basis of appropriately selected parameters, such as dose and energy, in order to establish a certain degree of counter doping, thereby providing a conductivity type that is opposite to the conductivity type of the body region 203. That is, during the implantation process 211, the corresponding process parameters may be selected such that the dopant concentration may be centered at any appropriate height level within the fin 210 in order to define a vertical position of the second channel region 203B, while also adjusting the overall vertical extension thereof by using appropriately selected parameters.

Figure 2F:
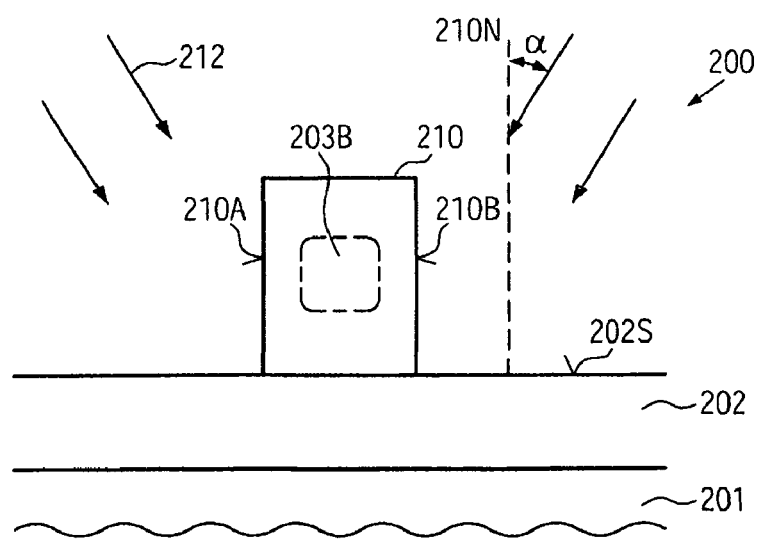

FIG. 2f schematically illustrates the transistor 200 according to illustrative embodiments in which a lateral restriction of the second channel region 203B may be accomplished if demanded by the overall device and process requirements. For this purpose, a further implantation process 212 may be performed on the basis of a tilt angle $\alpha$. That is, the ion beam during the implantation process 212 may be directed under the angle $\alpha$ with respect to a surface normal 210N of the surface 202S of the layer 202. Furthermore, the implantation energy may be appropriately selected to restrict the average penetration depth such that a desired degree of "counter doping" of the second channel region 203B at the sidewall surfaces 210A, 210B may be accomplished. It should be appreciated that the implantation process 212 in combination with the process 211 may be performed such that the desired degree of doping in the body region 203 may be obtained. As previously explained, the tilted implantation process 212 may be optional if a lateral extension of the second channel region 203B substantially across the entire width of the fin 210 may be considered appropriate.

Figure 2G:
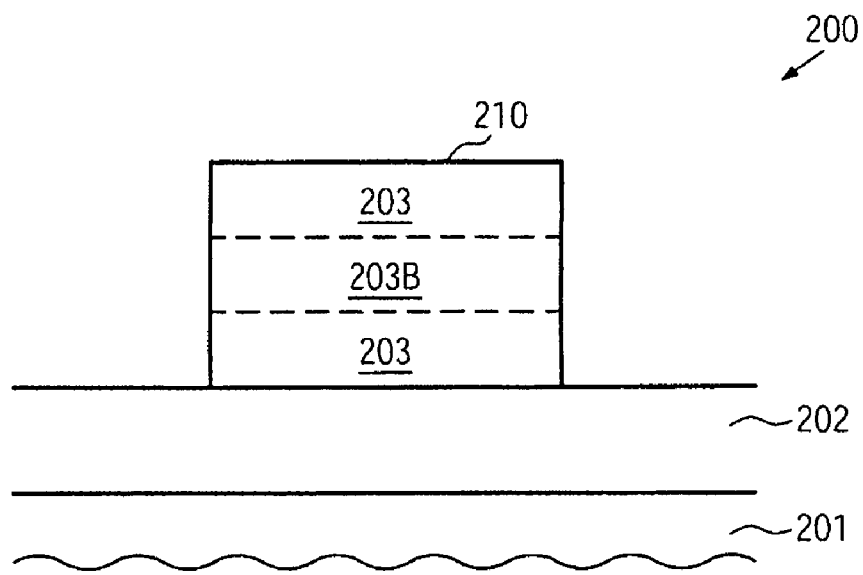

FIG. 2g schematically illustrates a sectional view of the transistor 200 along the length direction of the fin 210. As illustrated, the second channel region 203B may be appropriately positioned within the body region 203, while a lateral restriction with respect to the width direction of the fin 210 may also be provided, if the implantation process 212 has been performed (see FIG. 2e). Furthermore, in this manufacturing stage, the body region 203 and the second channel region 203B may connect to areas in which the drain and source regions 204 (see FIG. 2c) are still to be formed.

Figure 2H:
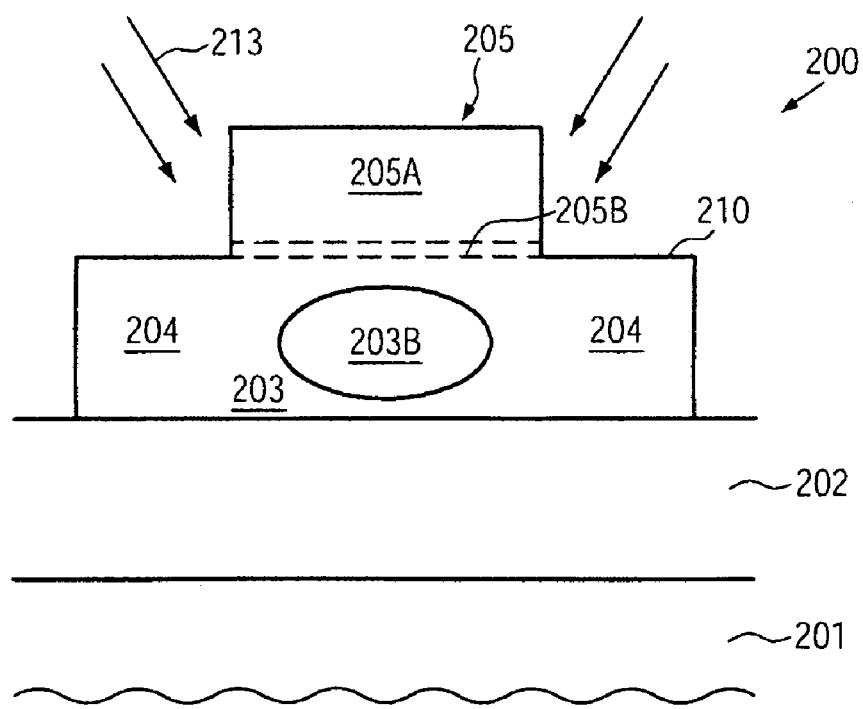

FIG. 2h schematically illustrates a sectional view along the length direction of the fin 210 in a further advanced manufacturing stage of the transistor 200. As illustrated, the gate electrode structure 205 is formed around a central portion of the fin 210 which may be accomplished by well-established three-dimensional transistor manufacturing techniques. That is, the gate insulation material 205B may be formed, for instance by deposition, oxidation and the like, followed by the gate electrode material 205A, which may be comprised of polysilicon and the like. Next, sophisticated patterning techniques may be used in order to obtain the gate electrode structure 205 as shown. Thereafter, an appropriately designed implantation sequence may be performed to create the desired dopant concentration in the drain and source regions 204, which may include a halo implantation process 213, i.e., an implantation process in which the characteristics of the PN junctions between the body region 203 and the drain and source regions 204 may be adjusted. Hence, during the halo implantation process 213, a dopant species may be introduced providing the same conductivity type as the body region 203. In some illustrative embodiments, the halo implantation 213 may be appropriately designed such that the second channel region 203B, which has the same conductivity type as is to be established in the drain and source regions 204, may be isolated from the drain and source areas 204, as indicated in FIG. 2h. Consequently, the second channel region 203B may be embedded in the body region 203, at least in the transistor length direction, i.e., the length direction of the fin 210, by means of the halo implantation 213.

Figure 2I:
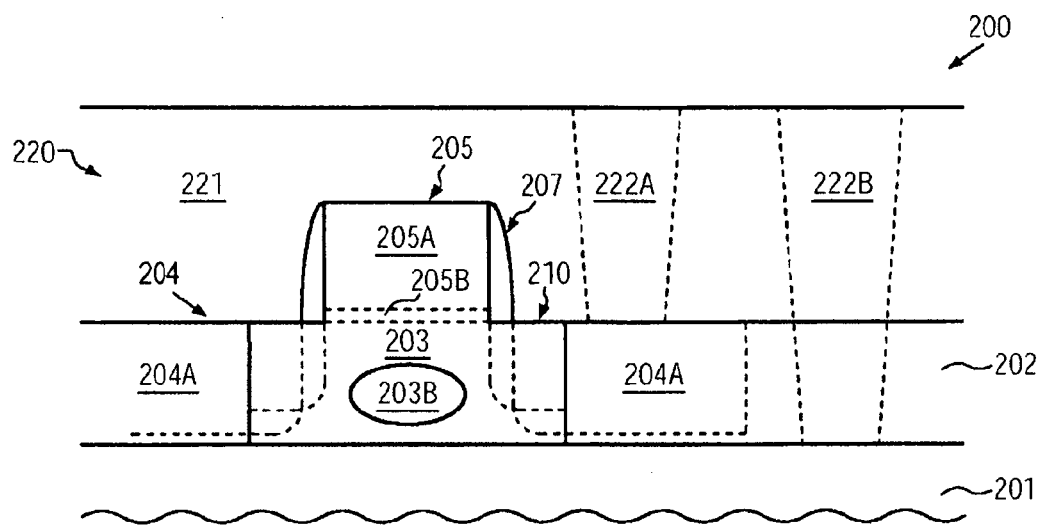

FIG. 2i schematically illustrates the transistor 200 in a further advanced manufacturing stage. As illustrated, the transistor 200 may comprise a spacer structure 207 formed on end portions of the gate electrode structure 205, which may define the lateral profile of the dopant concentration of the drain and source regions 204 formed in end portions of the fin 210. Furthermore, as previously discussed with reference to FIG. 2d, a respective common drain and source area 204A may be formed above the layer 202 so as to connect to the fin 210 and thus to the drain and source regions 204. Moreover, a contact structure 220 may be formed above the fin 210 and the gate electrode structure 205, which may comprise any appropriate dielectric material 221, such as silicon dioxide, silicon nitride and the like, in which respective contact elements 222A and 222B may be provided. For example, the contact element 222A may connect to the drain and/or source areas 204A while the contact element 222B may connect to a portion of semiconductor material, which may connect to the body region 203, thereby establishing a body contact.

The transistor 200 as shown in FIG. 2i may be formed on the basis of well-established three-dimensional transistor manufacturing processes. For example, the common drain and source areas 204A may be formed on the basis of epitaxial growth techniques followed by the formation of the spacer structure 207, which may be used as an implantation mask for defining an appropriate concentration gradient between the drain and source areas 204 and the body region 203. After forming the drain and source regions 204 and the areas 204A by ion implantation, further performance enhancing techniques, such as providing metal silicide regions (not shown) and the like, may be performed. Thereafter, the contact layer 220 may be formed by depositing the dielectric material 221 and forming the contact elements 222A, 222B therein according to well-established patterning techniques.

It should be appreciated that any other process sequence may be used for forming the transistor 200, as long as the second channel region 203B may be provided within the body region 203. For example, the body contact 222B may be formed on the basis of other process techniques, for instance by connecting to the body region 203 through an extended portion of the gate electrode structure 205 and the like.

Figure 2J:
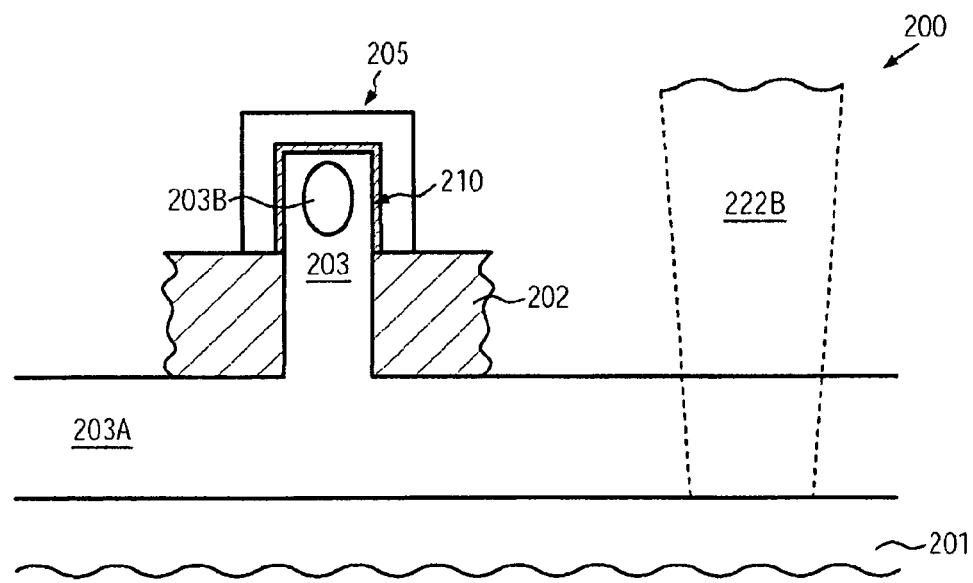
FIG. 2j schematically illustrates a cross-sectional view of a three-dimensional transistor having a "bulk" configuration and a corresponding body contact, according to further illustrative embodiments.

FIG. 2j schematically illustrates a cross-sectional view of the transistor 200 according to still further illustrative embodiments, in which the fin 210 may be provided in a "bulk" configuration in which the body region 203 may connect to an underlying semiconductor layer 203A by forming appropriate recesses in the layer 203A and providing an isolation structure 202 at a lower portion of the fin 210, thereby appropriately adjusting the effective height of the fin 210, while at the same time providing a conductive path of the remaining semiconductor layer 203A. Consequently, electrical connection to the body region 203 may be established via the semiconductor layer 203A by means of the contact element 222B.

Figure 3A:
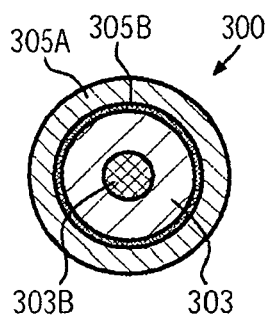
FIGS. 3a-3c schematically illustrate cross-sectional views of a tube-like transistor configuration, such as a nano wire transistor or nano pipe transistor, including a double channel configuration, according to further illustrative embodiments.
Figure 3B:
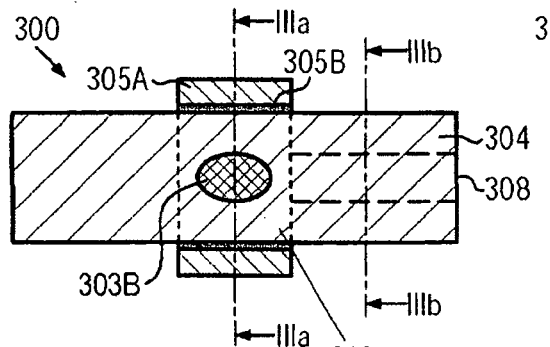
Figure 3C:
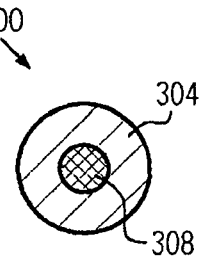

With reference to FIGS. 3a-3c, further illustrative embodiments of a three-dimensional transistor structure may be described.

FIG. 3a schematically illustrates a cross-sectional view of a three-dimensional transistor 300 having a tube-shaped configuration. As illustrated, a body region 303B may be enclosed by a gate electrode structure, which may comprise a gate electrode material 305A and a gate insulation material 305B. Moreover, a second channel region 303B may be embedded in the body region 303. In the embodiment shown, the gate electrode structure may substantially completely enclose the body region 303, thereby providing an enhanced degree of controllability of the body region 303, which may act as a first channel region, and the second channel region 303B.

FIG. 3b schematically illustrates a section along the transistor length direction. As illustrated, the drain and source regions 304 may be provided in a tube-shaped basic semiconductor material and may connect to the body region 303, while the second channel region 303B may be isolated from the drain and source regions 304, as is explained above with reference to the transistor 200. As previously explained, the body region 303 may exhibit a first conductivity type that is different from the conductivity type of the drain and source regions 304 in order to provide the required basic transistor behavior. Moreover, the second channel region 303B may have the opposite conductivity type with respect to the body region 303. Consequently, also in this case, the desired three-state behavior may be obtained, as has previously been explained with reference to FIG. 1b.

FIG. 3c schematically illustrates the transistor 300 according to illustrative embodiments in which a section along the line IIIb of FIG. 3b is illustrated. A contact region or body contact 308 may be provided in the drain and/or source areas, for instance by using a dopant concentration to establish the first type of conductivity, thereby substantially isolating the body contact 308 from the drain and/or source region 304. Furthermore, the region 308 may connect to the body region 303 so that the body region 303 may be maintained at a desired potential.

The three-dimensional transistor 300 may be formed in accordance with well-established process techniques, wherein, additionally, a corresponding implantation process may be performed prior to forming the gate electrode structure in order to obtain the required dopant concentration and thus conductivity type for the second channel region 303B. After forming the gate electrode structure, the second channel region 303B may be isolated with respect to the drain and source areas 304 on the basis of a halo implantation, as is similarly described with reference to the device 200. Thus, the manufacturing steps for forming the second channel region 303B may be readily implemented into the overall well-established process flow for forming tube-shaped transistor configurations without significantly adding to overall process complexity.

Figure 4:
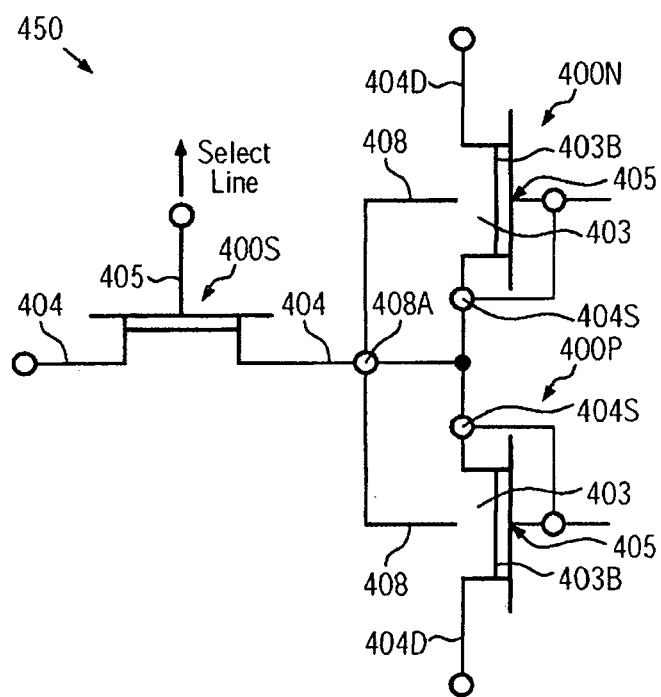
FIG. 4 schematically illustrates a memory cell in the form of a static RAM cell including three-dimensional double channel transistors with a body contact in which a reduced number of transistor elements may be used in accordance with still further illustrative embodiments.

FIG. 4 schematically illustrates an electronic circuit 450 which comprises one or more three-dimensional double channel transistors, such as the transistors 200 and 300, as previously described. The electronic circuit 450 is illustrated in the form of a circuit diagram, wherein it should be appreciated that the circuit 450 may be provided in the form of an integrated circuit in which the individual circuit elements may be formed in a single chip area, while, in other cases, separate semiconductor devices may be externally connected to obtain the electronic circuit 450. In one illustrative embodiment, the circuit 450 may represent a static RAM memory cell configured to allow the storage of at least one bit of information. As illustrated, the memory cell 450 may comprise a first transistor 400N which may represent a three-dimensional N-channel transistor, which may exhibit a three-state behavior, as previously explained. For instance, the N-channel transistor 400N may have a configuration as previously described with reference to the transistors 200 and 300. Thus, the transistor 400N may comprise a gate electrode structure 405, a source region 404S, which may be connected to the gate electrode structure 405. Furthermore, a drain region 404D may be provided and may be connectable to the supply voltage. Furthermore, a body contact may be provided and may connect to a body region 403, in which may be embedded a second channel region 403B. It should be appreciated that, although the various components described above are indicated within the circuit diagram, the components may be provided in a form as previously described with reference to the devices 200 and 300. Similarly, a second transistor 400P may be provided, for instance in the form of a P-channel transistor, which may also exhibit a three-state behavior, as previously described. Hence, the transistor 400P may comprise a gate electrode 405, a source region 404S connected to the gate electrode structure 405 of the P-channel transistor 400P and may also be connected to the source region 404S of the transistor 400N. Furthermore, a drain region 404D may be connected to the negative supply voltage. Similarly, a body contact 408 may connect to a body region 403 in which a second channel region 403B may be embedded. It should be appreciated that the various components of the P-channel transistor 400P, such as the drain and source regions 404S, 404D, the body region 403 and the second channel region 403B may have the opposite conductivity type compared to the corresponding components of the N-channel transistor 400N.

The memory cell 450 may further comprise a transistor 400S which may represent a select transistor and which may be provided in the form of a three-dimensional double channel N-channel transistor or in the form of a conventional three-dimensional transistor and the like. As indicated, a gate electrode 405 of the transistor 400S may be connected to a select line (not shown) while one of the drain and source regions 404 may be connected to a bit line (not shown), while the other one of the drain and source regions 404 of the transistor 400S may be connected to a common node 408A of the respective body contacts 408 of the transistors 400N, 400P.

It should be appreciated that the electronic circuit 450, for instance in the form of a static RAM cell as shown in FIG. 4, may be formed on the basis of manufacturing techniques as previously explained with reference to the three-dimensional transistors 200 and 300. During the operation of the memory cell 450, the three-state behavior of the transistors 400N, 400P in combination may provide stable states at the signal node 408A, depending on appropriate input voltage pulses in order to set or reset the signal node 408A. Thus, during the write operation of the memory cell 450, the select line may receive an appropriate voltage so as to switch on the select transistor 400S, while an appropriately selected write pulse supplied by the bit line may set the signal node 408A to a logic high level or low level, depending on the information bit to be written into the memory cell 450. Due to the three-state behavior of the transistors 400N, 400P, a corresponding level may be maintained and may be read out during a read operation by turning on the select transistor 400S and connecting the signal node 408A with a respective amplifier (not shown) in order to detect the state of the signal node 408A.

Consequently, a static RAM cell may be provided with three transistors, wherein at least two three-dimensional transistors with an internal double channel configuration may be used in order to provide a high degree of scalability in view of sophisticated device generations in which reduced lateral transistor dimensions may be accomplished by means of a three-dimensional configuration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A field effect transistor, comprising:
   a drain region and a source region having a first conductivity type;
   a body region formed at least between said drain and source regions, said body region having a second conductivity type other than said first conductivity type, said body region comprising at least two non-coplanar surface areas;
   a gate insulation material formed on said at least two non-coplanar surface areas;
   a gate electrode formed on said gate insulation material so as to define a first channel region in said body region at least adjacent to said two non-coplanar surface areas; and
   a second channel region at least partially embedded in said body region and having said first conductivity type.

2. The field effect transistor of claim 1, wherein said channel region is separated from said drain and source regions by material of said body region having said first conductivity type.

3. The field effect transistor of claim 1, further comprising a body contact connecting to said body region.

4. The field effect transistor of claim 3, wherein said body contact is separated from said second channel region by material of said body region that has said first conductivity type.

5. The field effect transistor of claim 1, wherein said body region comprises at least one further surface area that is non-coplanar to said at least two non-coplanar surface areas and wherein said gate insulation material is formed on said at least one further surface area.

6. The field effect transistor of claim 1, wherein said body region comprises a bottom surface formed on a dielectric layer having a thickness that is greater than a thickness of said gate insulation material.

7. The field effect transistor of claim 6, wherein said drain and source regions are formed on said dielectric layer.

8. The field effect transistor of claim 1, wherein said body region is formed on a semiconductor substrate material.

9. The field effect transistor of claim 8, wherein said drain and source regions are formed on said semiconductor substrate material.

10. The field effect transistor of claim 1, wherein said body region is contained in a semiconductor fin having two sidewall surface areas as said at least two surface areas and wherein a width of said fin is approximately 30 nm or less.

11. The field effect transistor of claim 10, wherein a height of said fin is approximately 50 nm or less.

12. The field effect transistor of claim 10, further comprising a plurality of fins, each of which containing a respective one of said second channel region.

13. A field effect transistor, comprising:
    a drain region and a source region having a first conductivity type;
    a tube-shaped body region formed between said drain and source regions, said body region having a second conductivity type other than said first conductivity type;
    a gate insulation material formed on a surface area of said tube-shaped body region;
    a gate electrode formed on said gate insulation material; and
    a second channel region formed in said body region and having said first conductivity type.

14. The field effect transistor of claim 13, wherein said second channel region is separated from said drain and source regions by material of said body region having said first conductivity type.

15. The field effect transistor of claim 13, further comprising a body contact connecting to said body region.

16. The field effect transistor of claim 15, wherein said body contact is separated from said second channel region by material of said body region that has said first conductivity type.

17. The field effect transistor of claim 13, wherein said gate electrode substantially completely encloses said body region along a circumferential direction.

18. A memory cell, comprising:
    at least one three-dimensional field effect transistor, said three-dimensional field effect transistor comprising a body region containing a first area having a first conductivity type and a second area having a second conductivity type opposite to said first conductivity type, said three-dimensional field effect transistor further comprising a body contact connected to said first area.

19. The memory cell of claim 18, wherein said three-dimensional field effect transistor comprises a fin accommodating said body region.

20. The memory cell of claim 18, wherein said three-dimensional field effect transistor comprises a tube-shaped semiconductor element that comprises said body region.

21. The memory cell of claim 18, wherein said memory cell is a static RAM cell.

22. The memory cell of claim 21, wherein said memory cell comprises less than six transistors.

23. The memory cell of claim 22, wherein said memory cell is formed of three transistors.

* * * * *